United States Patent [19]

Chen

[11] Patent Number: 5,422,790
[45] Date of Patent: Jun. 6, 1995

[54] COMPUTER CHIP MOUNTING HARDWARE FOR HEAT DISSIPATION

[76] Inventor: Pao-Chin Chen, 4F, No. 292, Sec. 2, Chien Kuo S. Rd., Taipei, Taiwan, Prov. of China

[21] Appl. No.: 198,983

[22] Filed: Feb. 18, 1994

[51] Int. Cl.6 .............................................. H05K 7/20
[52] U.S. Cl. ..................................... 361/719; 24/458; 248/510; 257/719; 361/785
[58] Field of Search ...................... 439/65, 69, 70, 74, 439/485; 257/706, 707, 718, 719; 174/16.3; 267/150, 160; 165/80.3, 185; 248/316.7, 505, 510; 24/295, 457, 458, 473, 625; 411/352, 516, 520, 522, 525; 361/690, 703, 704, 718, 719, 784, 785, 790, 791

[56] References Cited

U.S. PATENT DOCUMENTS

| | | | |
|---|---|---|---|
| 3,858,958 | 1/1975 | Davies | 361/785 |
| 4,716,498 | 12/1987 | Ellis | 361/386 |
| 4,899,255 | 2/1990 | Case | 361/386 |
| 5,170,325 | 12/1992 | Bentz | 361/388 |
| 5,268,820 | 12/1993 | Tseng | 361/785 |
| 5,327,324 | 7/1994 | Roth | 361/707 |

Primary Examiner—Gerald P. Tolin
Attorney, Agent, or Firm—Bucknam and Archer

[57] ABSTRACT

A computer chip mounting hardware includes a mother board having two electrical connectors at the top; a sub PC board having two electrical connectors at the bottom respectively connected to the electrical connectors on the mother board and a center opening for heat dissipation; a computer chip electrically connected to the sub PC board at the bottom and suspended above the mother board for letting heat be dissipated through the center opening on the sub PC board and the space between the computer chip and the mother board; and a heat conductive clamp bridged over two opposite sides of the sub PC board and clamped on two opposite sides of the computer chip for dissipating heat from the computer chip.

2 Claims, 3 Drawing Sheets

COMPUTER CHIP MOUNTING HARDWARE FOR HEAT DISSIPATION

BACKGROUND OF THE INVENTION

The present invention relates to a computer chip mounting hardware which permits heat from the computer chip to be effectively dissipated without the use of an air fan.

Various computer chip mounting methods and devices, such as SMT, DIE SOCKET etc. have been disclosed, and have been widely employed. However, these conventional methods or devices do not allow heat to be dissipated from the back side of the computer chip. If heat is not effectively dissipated, the computer chip may be damaged easily. In order to eliminate this problem, an air fan may be installed. However, an air fan needs much installation space in a mobile computer and will consumes much power supply.

SUMMARY OF THE INVENTION

The present invention has been accomplished to provide a computer chip mounting hardware which eliminates the aforesaid problems. By suspending the computer chip above the mother board and making an opening on the sub PC board., to which the computer chip is connected, heat from both sides of the computer chip can be dissipated through the opening on the sub PC board or the space between the computer chip and the mother board. A heat conductive clamp may be bridged over the sub PC board and clamped on two opposite sides of the computer chip to dissipate heat from the computer chip more effectively.

DETAILED DESCRIPTION OF THE PREFERRED EMBODIMENT

Figure 1:
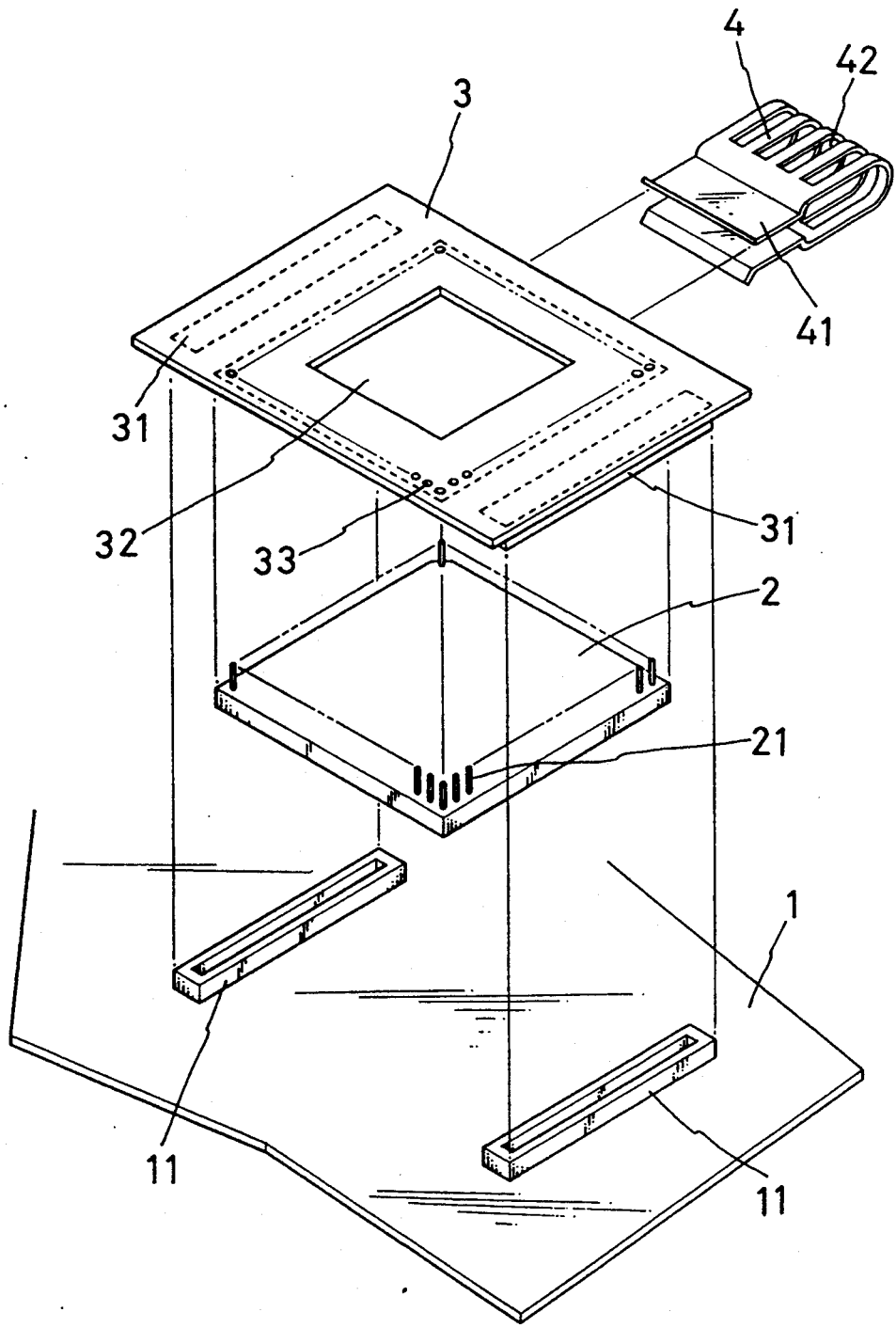
FIG. 1 is an exploded view of the present invention.

Referring to FIG. 1, the present invention is generally comprised of a mother board 1, a computer chip 2, and a sub PC board 3. The mother board 1 comprises two electrical connectors 11 for connection the sub PC board 3. The computer chip 2 has male contacts 21 disposed at the top for connection to the sub PC board 3. The sub PC board 3 comprises two electrical connectors 31 at the bottom for connection to the electrical connectors 11 on the mother board 1, a center opening 32 for heat dissipation, and a plurality of female contacts 33 around the center opening 32, which receive the male contacts 21 of the computer chip 2 respectively.

Figure 2:
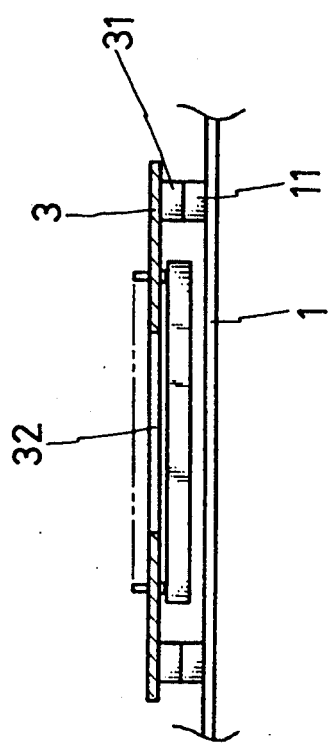
FIG. 2 is a side view showing the mother board, the computer chip, and the sub PC board electrically connected.

Referring to FIG. 2, when assembled, the sub PC board 3 is fastened to the mother board 1 at the top, and the computer chip 2 is fastened to the sub PC board 3 at the bottom and suspended above the mother board 1. Because the computer chip 2 does not contact the mother board 1, heat from the top and bottom surfaces of the computer chip 2 can be dissipated through the space between the computer chip 2 and the mother board 1, and the center opening 32 on the sub PC board 3 respectively.

Figure 3:
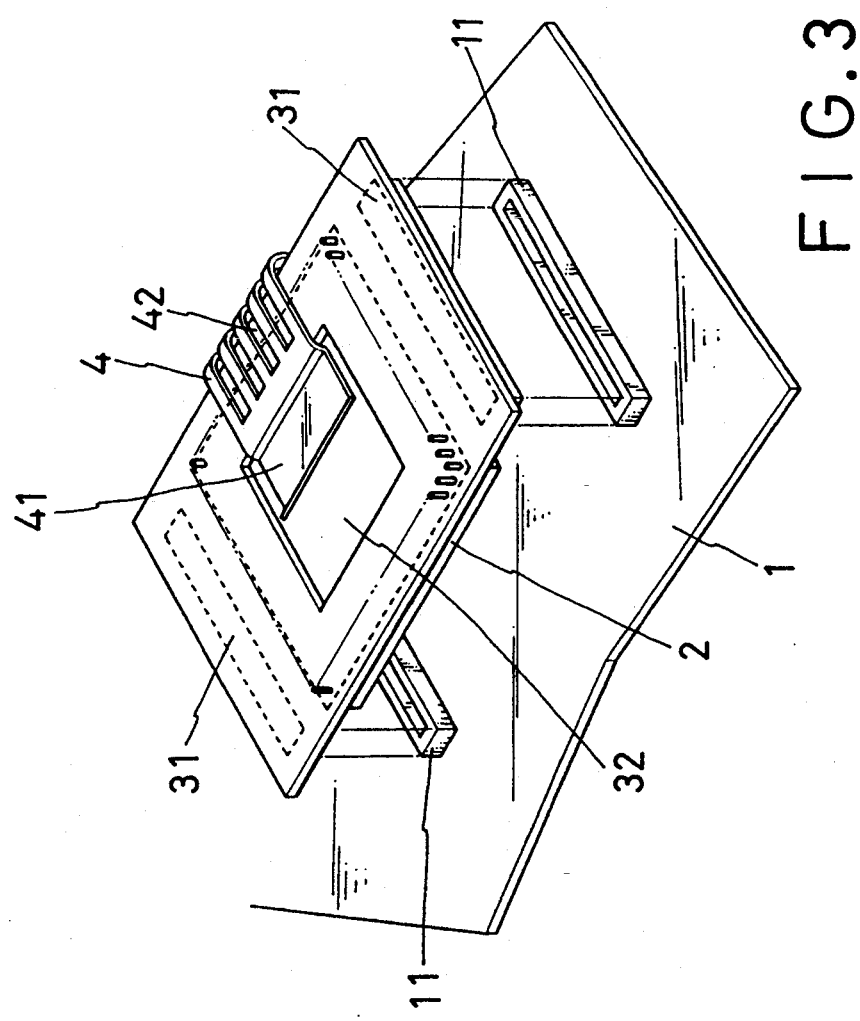
FIG. 3 shows a head conductive clamp bridged over the sub PC board and clamped on the computer chip for dissipating heat from the computer chip.

Referring to FIG. 3 and FIG. 1 again, a heat conductive clamp 4 may be fastened to the computer chip 2 for heat dissipation. The heat conductive clamp 4 comprises a slotted body 42 bridged over the two opposite surfaces of the sub PC board 3, and a clamping head 41 clamped on the two opposite sides of the computer chip 2 and disposed vertically aligned with the center opening 32 on the sub PC board 3. Therefore, when the computer chip 2 works, heat from the computer chip 2 can be transmitted through the heat conductive clamp 4 and then dissipated into the air via the slotted body 42 of the heat conductive clamp 4.

According to the aforesaid arrangement, heat from the computer chip 2 can be effectively dissipated without the installation of an air fan.

While only one embodiment of the present invention has been shown and described, it will be understood that various modifications and changes could be made without departing from the spirit and scope of the invention.

What is claimed is:

1. A computer chip mounting hardware comprising a mother board, a sub PC board connected to said mother board, and a computer chip connected to said sub PC board, wherein said mother board comprises two electrical connectors; said sub PC board comprises two electrical connectors respectively connected to the electrical connectors on said mother board, a center opening for dissipation of heat from said computer chip, and a plurality of female contacts around said center opening; said computer chip is suspended above said mother board, having a plurality of male contacts respectively connected to the female contacts on said sub PC board.

2. The computer chip mounting hardware of claim 1 further comprising a heat conductive clamp for dissipation of heat from said computer chip, said heat conductive clamp comprising a slotted body bridged over two opposite sides of said sub PC board, and a clamping head clamped on two opposite sides of said computer chip.

* * * * *